United States Patent
Veldhuizen et al.

(10) Patent No.: US 12,251,950 B2
(45) Date of Patent: Mar. 18, 2025

(54) ASSEMBLY FOR REPLICATING FLEXIBLE STAMPS FROM A MASTER

(71) Applicant: MORPHOTONICS HOLDING B.V., Veldhoven (NL)

(72) Inventors: Leon Willem Veldhuizen, Utrecht (NL); Jan Matthijs Ter Meulen, Eindhoven (NL); Bram Johannes Titulaer, Veldhoven (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 0 days.

(21) Appl. No.: 18/006,553

(22) PCT Filed: Jun. 30, 2021

(86) PCT No.: PCT/EP2021/068071
§ 371 (c)(1),
(2) Date: Jan. 23, 2023

(87) PCT Pub. No.: WO2022/022937
PCT Pub. Date: Feb. 3, 2022

(65) Prior Publication Data
US 2023/0294442 A1   Sep. 21, 2023

(30) Foreign Application Priority Data

Jul. 31, 2020   (EP) .................................... 20188862

(51) Int. Cl.
*G03F 7/00*   (2006.01)
*B41K 1/50*   (2006.01)

(52) U.S. Cl.
CPC .............. *B41K 1/50* (2013.01); *G03F 7/0002* (2013.01)

(58) Field of Classification Search
None
See application file for complete search history.

(56) References Cited

U.S. PATENT DOCUMENTS 7,077,992 B2   7/2006   Sreenivasan et al.
8,027,086 B2   9/2011   Guo et al.
(Continued)

FOREIGN PATENT DOCUMENTS

CN   105911815 A   8/2016
CN   109116680 A   1/2019
(Continued)

OTHER PUBLICATIONS

Jong G. Ok et al, "A step toward next-generation nanoimprint lithography: extending productivity and applicability"; Appl. Phys. A 121:343-356 (2015).
(Continued)

*Primary Examiner* — Joshua D Zimmerman
(74) *Attorney, Agent, or Firm* — Merchant & Gould P.C.

(57) ABSTRACT

An assembly includes a master for imprinting of microstructures and nano-structures. The master has on its upper surface an active area with relief structure for imprinting of the micro-structures and nano-structures, and the master has a thickness $d_{master}$. The assembly includes frame pieces arranged around and flushing along the outer circumference of the master, with the frame pieces having a thickness $d_{frame}$. The thickness $d_{frame}$ of the frame pieces deviates from the thickness $d_{master}$ of the master by at most 250 μm. A a flexible stamp has improved alignment.

14 Claims, 10 Drawing Sheets

(56) References Cited

U.S. PATENT DOCUMENTS

| | | |
|---|---|---|
| 2004/0124566 A1 | 7/2004 | Sreenivasan et al. |
| 2010/0200146 A1 | 8/2010 | Zhu et al. |
| 2016/0054498 A1 | 2/2016 | Chung et al. |
| 2018/0113242 A1 | 4/2018 | Lee et al. |
| 2020/0033721 A1 | 1/2020 | Guo et al. |
| 2021/0086407 A1* | 3/2021 | Peng ........................ B29C 33/56 |

FOREIGN PATENT DOCUMENTS

| | | |
|---|---|---|
| WO | 2017/032758 A1 | 3/2017 |
| WO | 2019/236136 A1 | 12/2019 |

OTHER PUBLICATIONS

International Search Report and Written Opinion for PCT/EP2021/068071 (Oct. 27, 2021).

* cited by examiner

ASSEMBLY FOR REPLICATING FLEXIBLE STAMPS FROM A MASTER

This application is a National Stage Application of PCT/EP2021/068071, filed Jun. 30, 2021, which claims benefit of European Patent Application No. 20188862.5, filed Jul. 31, 2020, and which applications are incorporated herein by reference. To the extent appropriate, a claim of priority is made to each of the above-disclosed applications.

The invention relates to an assembly and to a process for replication of flexible stamps for imprinting of micro- and nano-structures from a master.

Micro and nano structures are used to enhance the performance of products. This can for example be the improvement of the efficiency of solar panels, using anti-reflective structures, or the creation of an optical 3D effect for displays, by use of micro lenses.

Structures can be added to products by use of UV nano-imprint lithography (UV-NIL) technology. There are different types of this technology, as for instance wafer-scale UV-NIL, roll-to-roll imprinting UV-NIL or roll-to-plate UV-NIL imprinting. In each case a master structure, having the inverse structure as required on the product, is pressed upon the product with UV or thermal curable resin in between. After curing, the resin is solidified and the master is removed from the product. In a different method, a master having the required structure for imprinting of micro- and nano-structures is used to replicate from this master a flexible stamp. If necessary, an anti-stick surface may be added to this flexible stamp, after which this stamp is used to make a manifold of product replications.

In general, masters have a distinct thickness. From this thickness, a drawback may result with respect to the quality of flexible stamps replicated from the masters. When replicating from such masters, it is often the aim to replicate the full surface of the master. Therefore, part of the resin which is used for making the flexible stamp from the master may flow aside of and underneath the master. This may contaminate the rear side of the master and create uncontrolled step-heights and/or bumps on the flexible stamp, often having a thickness of 500 µm or more, sometimes even up to about 1 mm. This may have detrimental effects, as the flexible stamp may wrinkle due to the thick resin layer and/or the bumps will affect the replication quality in next replication steps for producing the final products. To solve the problem resulting from overflowing resin, often only an inner area of the master is spin-coated with resin while the outer area is left uncoated. However, in this case not the full area of the master is utilized for replication.

Another negative effect of an uncontrolled and pronounced height step, bordering the master, can be that, e.g. due to the use of compressible imprint rollers that are often used, the pressure near the edges of the master is not the same as the pressure far from the edges, i.e. in the inner area of the master.

Masters often have a small surface area. However, for the imprint technology there is a need to go to large area imprinting. This is for two reasons:
1) To have the opportunity to imprint textures on large products (i.e., solar panels or large displays).
2) To replicate multiple products in one replication cycle. Hereby the throughput is strongly increased.

For large-area replication, a large-area master is required. The cost of the master depends on the manufacturing time, and thereby the size of the master. Large area masters are therefore expensive. In roll-to-roll imprint technology this problem can be solved by using a seamless drum, as is for example disclosed in WO 2017/032758 A1. In this case, the diameter of the drum is carefully chosen to make sure that a continuous area is present without stitch lines. However, not all textures can be made in this manner at an affordable price.

A different solution is to make a large scaled-up master out of a small base master. With use of a step and repeat manner, the master structure is copied multiple times in a matrix structure. In between the replicated areas there are stitch or splice lines. By optimizing the process, it is tried to have the stitch or splice width as small as possible. Examples of step and repeat methods are described e.g., in US2004/0124566 A1, U.S. Pat. No. 7,077,992 B2, using a wafer stepper, and KR 1017807289 B1, using a roller. KR 1017807289 B1 even aims at avoiding any stitch lines which may be visible borders in displays products. According to this document, a tiling technique is applied such that the replicated areas are arranged so that the replicated areas overlap at their adjacent edges (see also non-patent literature Jong G. Ok et al, "A step toward next-generation nanoimprint lithography: extending productivity and applicability"; Appl. Phys. A (2015) 121:343-356).

A different method to enlarge the master is to tile multiple master units physically together. This is done for instance in U.S. Pat. No. 8,027,086 B2. Hereby flexible plastic master tiles are wrapped and fixed on the diameter of a stainless-steel roller. In this case the stitch area will often be larger compared to the step and repeat method. By pressing the different master unit tiles together, the stitch area or seam between the master units is kept as small as possible. For certain textures the obtained larger stitch or splice width or seam width can be acceptable. Moreover, it enables a second possibility; the tiling of multiple products together on one scaled-up master. CN 105911815 A discloses splicing of a plurality of master tiles or template units together to form a tile pattern. The template units are arranged on a substrate along alignment marks.

The tiling of multiple masters or of a plurality of nanoimprint template units to one scaled-up master will only work if the quality of the stitches is well controlled. During the tiling process, the position accuracy should be well controlled. Only with a well-controlled position accuracy the imprinted samples made with the scaled-up master can be cut in straight lines. However, the seam appearance between the tiled master units and the seam width between the tiled master units often is of insufficient quality in that the width is too big and/or the tiled master units are misaligned and/or rotated.

An improved approach is described in the, at the time of writing, unpublished European patent application no. EP19202151.7, which relates to a scaled-up master for imprinting of micro- and nano-structures, the master being made-up from tile-shaped master units. For these scaled-up master adjoining edges of neighboring master units are parallel with each other and wherein the master units forming the master are arranged such that the splice lines between the master units only have junctions between master units where at most three corners of neighboring master units are brought together. This document also discloses a flexible stamp copied from such scaled-up master.

The problems related to resin overflow and creation of uncontrolled step-heights and/or bumps on the flexible stamp replicated from a master is in particular evident, in the case when large size scaled-up masters are employed, e.g., tiled scaled-up masters. Moreover, when using tiled scaled-up masters made-up from a multitude of tiled master units, problems of misalignment may arise, as has been outlined above.

The underlying challenge that the present invention addresses is therefore to make available an assembly for replication of flexible stamps for imprinting of micro- and nano-structures from a master which assembly comprises a master wherein the assembly allows for using the whole area of the master for replication without detrimental effects by resin overflow and/or non-uniform imprint pressure effects. It is a further object of the present invention to make available a process for replication of a flexible stamp for imprinting of micro- and nano-structures from a master, in which the whole area of the master can be utilized for replication without detrimental effects by resin overflow and/or non-uniform imprint pressure effects. Furthermore, it is an object of the present invention to make available an assembly for replication of high accuracy flexible stamps for imprinting of micro- and nano-structures from a large-scale master, in particular from a master made-up from a multitude of tiled master units.

The problem is solved by an assembly comprising a master for imprinting of micro- and nano-structures, which master being arranged on a substrate carrier and having on its upper surface an active area with relief structure for imprinting of the micro- and nano-structures, wherein the master having a thickness $d_{master}$, the assembly further comprising a set of frame pieces being mounted on the substrate carrier and arranged around and flushing along the outer circumference of the master, with the frame pieces having a thickness $d_{frame}$, wherein the thickness $d_{frame}$ of the frame pieces deviates from the thickness $d_{master}$ of the master by at most 250 µm.

With the assembly of the invention, it is possible to at least reduce uncontrolled resin flow aside of the master. Moreover, it is possible to at least reduce generation of uneven bumps and uncontrolled step heights at the outer edges of flexible stamps replicated from a master. In contrast to prior art processes, the use of the present assembly comprising frame pieces allows for use of the full surface area of the master. On the other hand, when adjusting the thickness of the frame pieces to the required predetermined value in relation to the thickness of the master so that the thickness of the frame pieces deviates from the thickness the master by at most 250 µm, it is possible to control the height step near texture and adjust it to a predetermined value, resulting in defined conditions at the edges of the master and of the replicated flexible stamp as well as in the frame area.

The arrangement may include a substrate carrier, onto which master and frame pieces are mounted as discrete pieces. The substrate carrier may for example be rigid and may be in form of a glass, ceramic of metal panel. Preferably the substrate carrier is made from a rigid or flexible polymeric material such as polycarbonate (PC), polyethylenenaphthalate (PEN), polyethyleneterephthalate (PET or PETP), biaxial oriented polyethylene terephthalate (BO-PET) or polymethylmethacrylate (PMMA).

Within the framework of the present application the expression "frame piece" refers to a discrete piece of material which is arranged around the master wnd which is separate from the substrate carrier or support. Thus, in the assembly of the invention, master and frame pieces are mounted and are arranged as discrete pieces on the substrate carrier and thus, are distinct and separate from the substrate carrier. Preferably master and/or frame pieces are removably mounted on the substrate carrier but can also be adhered to the substrate carrier e.g. by a glue.

The use of the assembly of the invention with the set of frame pieces according to the invention, which frame pieces being discrete pieces separate from the substrate carrier, offers in addition to the advantages described above the advantage of a flexible adaption of the frame pieces to the needs of the process for imprinting of micro- and nano-structures. The frame pieces easily can be adapted e.g. to the shape or size of the master which is used. Moreover, the frame pieces of the set of frame pieces may be such that they are flush with only one of the side edges of the master or they may be flushed with more of the sides of the master. The set of frames pieces may even consist of only one frame piece being flush with all side edges of the master. Furthermore, the frame pieces of the set of frame pieces in a flexible manner may be chosen with respect to their thickness in order to set a defined height difference between the thickness of the master and the thickness of the frame pieces, i.e. a defined height step between master and frame pieces, as will be discussed later below.

In a preferred embodiment, the master is not a single piece master but may be a scaled-up master which is made-up from a multitude of tiled master units having on their upper surfaces active areas with relief structure for imprinting of the micro- and nano-structures, wherein the upper surfaces of the tiled master units forming in total the upper surface of the scaled-up master. In particular in this case when the master is a scaled-up master which is made-up from several tiled master units, often a highly accurate alignment of the master units in the imprint process is difficult to achieve. In many cases the position accuracy of the master units which can be achieved is insufficient, e.g. in case of four master units or tiles are used having a square or rectangular shape and meeting with their corners at a center point thus forming a cross joint, as is discussed in unpublished European patent application no. 19202151.7. By using frame pieces surrounding the scaled-up master unit being formed from tiled master units, alignment or (self-) alignment of the tiles, i.e. of the tiled master units can be facilitated.

In a further preferred embodiment, alignment marks may be applied to the frame pieces and thus outside active areas of the master. The alignment marks may, for example, be in form of crosses or dots applied to the upper surfaces of one or more of the frame pieces, e.g. in form of a relief structure. Such alignment marks may be advantageous in later process steps, e.g. in cutting steps, thus allowing exact cutting-out of final imprint products.

Therefore, the present invention also relates to the use of the present assembly comprising frame pieces to facilitate alignment of tiled master units in a process for replicating a flexible stamp from a scaled-up master being made-up from a multitude of tiled master units, wherein the tiled master units and the frame pieces are mounted on a substrate carrier and are distinct from the substrate carrier.

In an embodiment of the invention when the master is a scaled-up master which is made-up from a multitude of tiled master units, the set of frame pieces may further comprise intermediate frame pieces being mounted on the substrate carrier, being separate from the substrate carrier, being arranged between tiled master units forming the scaled-up master and flushing along the side edges of the tiled master units adjoining the intermediate frame pieces. Intermediate frame pieces may be present between all of the tiled master units building-up the scaled-up master or only between a part of the master units. When using such an assembly having also intermediate frame pieces, it is possible to control resin overflow at the outer circumference of the scaled-up master but also the local resin flow in the inner area of the scaled-up master and thus determine local resin outflow. Moreover, in case the tiled master units forming the scaled-up master e.g. have different textures or structures on their upper surfaces and thus lead to different imprint products, with intermediate frame pieces being arranged between tiled master units a clear distinction between the areas of the tiled master units and thus between the different imprint products is possible.

In an embodiment, the thickness $d_{frame}$ of the frame pieces is larger than the thickness $d_{master}$ of the master. Thereby, on purpose a defined height step is provided between the master and the frame pieces, with the step being at most 250 μm in height. In this case, the frame pieces may function as vertical spacers that provide imprint thickness control of the flexible stamp in a process for replicating flexible stamps from a master. Thus, the present invention also relates to the use of frame pieces for controlling the thickness of a flexible stamp in a process for replicating the flexible stamp from a master, wherein the master has a thickness $d_{master}$ and the frame pieces have a thickness $d_{frame}$ and wherein the thickness $d_{frame}$ of the frame pieces is at least 2 μm and at most 250 μm larger than the thickness $d_{master}$ of the master, in which process frame pieces are arranged around and flushing along the outer circumference of the master.

In another embodiment, the thickness $d_{frame}$ of the frame pieces is less than the thickness $d_{master}$ of the master. On purpose, a defined and even height step is provided between the master and the frame pieces, with the step being at most 250 μm in height. In case, the frame pieces are in a defined manner thinner than the master A controlled resin flow during the imprint process into the frame area results in the flexible stamp replicated from the master of this preferred embodiment having at the frame area a controlled and even step increase in thickness. This step increase in thickness of the flexible stamp may later on serve as a vertical spacer that provides imprint thickness control of the final imprint product in a process for replicating the final imprint product from the flexible stamp. Thus, the present invention also relates to the use of frame pieces for controlling the thickness of a flexible stamp in a frame area in a process for replicating the flexible stamp from a master wherein the master has a thickness $d_{master}$ and the frame pieces have a thickness $d_{frame}$ and wherein the thickness $d_{frame}$ of the frame pieces is at least 2 μm and at most 250 μm less than the thickness $d_{master}$ of the master, in which process frame pieces are arranged around and flushing along an outer circumference of the master.

The width of the frame pieces, i.e. the extension of the frame pieces perpendicular to the edge of the master they are flushing along, in general depends on the size of the master, i.e. the larger the master, the larger the width of the frame pieces should be. In order to have a positive function of the frame pieces, i.e. to have a significant effect of the frame pieces of the present assembly in a process for replicating flexible stamps from a master e.g. with respect to height control, resin outflow control etc., the frame pieces preferably should have a width of at least 5 mm. In addition, the width of the frame pieces preferably should be less than about 200 mm. More preferably, the width of the frame pieces should be at least 10 mm and likewise more preferably the width should be less than 150 mm.

In the process of replicating a flexible stamp from a master it is of advantage to have resin flow over the edges of the master in order to make use of the whole active area of the master. This is the more of advantage in cases, when an active area covers at least most of the master upper surface. In case of use of the present assembly comprising frame pieces, resin flow can be controlled and easily be determined. In a preferred embodiment the frame pieces are made from a transparent material, e.g. are made from a glass, a transparent polymeric material or a transparent foil. In case of resin overflow into the area of the frame pieces, i.e. the frame area, regions of the frame pieces which are covered with resin are optically detectable due to different light reflection compared to areas without resin. The difference in light reflection can be determined by naked eye or preferably via a camera system, which would also allow for an automatic quality control during the imprint process. Resin flow detection in case of non-transparent frame pieces can e.g. be done through the stamp when the stamp itself is transparent.

In order to improve optical detectability of resin flow, in a further preferred embodiment of the assembly the frame pieces have an optically detectable relief structure on their upper surface, i.e. on their surface being directed in the same direction as the upper surface of the master. Thus, not only the master has on its upper surface an active area with relief structure for imprinting of the micro- and nano-structures, but also the frame pieces have a relief structure on their upper surface, wherein the relief structure of the frame pieces is optically detectable. The optically detectable relief structure of the frame pieces may be in form of a roughness of the surface, which preferably may have a depth of roughness of at least 250 nm and up to several tenths of μm. In a further embodiment, the optically detectable relief structure of the frame pieces may be in form of a hatching, a cross hatch, dots, etc. It simultaneously may serve as alignment marks to facilitate further process steps in the process for production of final imprint products, as mentioned before. Preferably the optically detectable relief structure of the frame pieces is different from the relief structure of the master.

In the preferred case of the frame pieces having an optically detectable relief structure, not only resin flow into the frame area advantageously can optically be detected during the process of replication of a flexible stamp from a master. The optically detectable relief structure on the upper surface of the frame pieces may also be transferable to the flexible stamp and thus may be useful during further processing, i.e. during replication of final imprint products from the flexible stamp.

Thus, the present invention also relates to the use of frame-pieces in a process for manufacturing of a flexible stamp, wherein the flexible stamp is replicated from a master having on its upper surface an active area with relief structure for imprinting of the micro- and nano-structures, wherein the frame pieces being arranged around and flushing along the outer circumference of the master and wherein the frame pieces having a relief structure on their upper surface to facilitate control of resin flow during an imprint process.

In a further advantageous embodiment of the assembly at least one of the frame pieces being arranged around and flushing along the outer circumference of the master is shaped and oriented such that two neighboring edges of the at least one frame piece form an extrapolation of two neighboring edges of the master. In this case, the length of the at least one frame piece does not have to be adapted exactly to the length of the edge of the master it adjoins, but the length of this at least one frame piece may be longer. In a more preferred embodiment, all of the frame pieces being arranged around and flushing along the outer circumference of the master are shaped and oriented such that two neighboring edges of each frame piece form an extrapolation of two neighboring edges of the master. In this case a mismatch of the length of the frame pieces to the length of the edges of the master can be avoided.

The outer contour or shape of the master comprised by the present assembly may have various geometries. The master preferably may have a square, rectangular, triangular or hexagonal shape or may have the shape of a trapezoid. In a likewise preferred embodiment, the master may have curved edges, which in a more preferred embodiment may have the form of a concave, convex or an oscillating curve or may have a sinusoidal shape or have the shape of a circle or oval.

The outer contour of the present assembly may follow the contour of the master comprised by the assembly, i.e. may have likewise a square, rectangular, triangular shape etc. However, in cases of the master having a shape deviating from a square or rectangular shape, i.e. in cases when the outer circumference of the master has a non-square and non-rectangular contour, it may be advantageous, if the arrangement of the frame pieces has at the inner edges of the frame pieces adjoining the master the contour of the master, while the outer contour of the arrangement of the frame pieces has a square or rectangular shape. Because handling of a square or rectangular element is easier compared to an element having a non-square or non-rectangular shape, this allows for an ease in the imprint process for replicating a flexible stamp from these types of masters, in particular if the master is a tiled scaled-up master built-up from a multitude of tiled master units. Thus, in a further preferred embodiment the outer circumference of the master has a non-quadratic and non-rectangular contour and the frame pieces arranged around the outer circumference of the master are shaped and arranged such that their edges adjoining the master are adapted in shape and size to follow the contour of the circumference of the master while the frame pieces with their outer edges form a square or rectangle.

In an embodiment, the assembly according to the invention may also be used as a rigid stamp in a plate-to-plate imprinting process.

The invention also pertains to a flexible stamp replicated from a master having on its upper surface an active area with relief structure for imprinting of micro- and nano-structures, rendered to the flexible stamp by the inventive assembly.

The tiling frame has an additional advantage. Typically, the base of the flexible stamp does not have anti-stick properties. If it comes in contact with resin, the flexible stamp will not delaminate well. The resin outflow over the outer tiling frame, will enlarge the resin area on the flexible stamp. In the flexible stamp manufacturing process, it will be made sure that the resin will have anti-stick properties (directly or after an anti-stick process). The resin will be a copy from the tiled/scaled-up master. This also means that an imprint of the tiling frames can be at least partly visible on the flexible stamp.

In essence, the invention concerns a flex stamp, whereby the flex stamp contains the inverse texture of parts of the frame area, copied onto the flex stamp while making the flex stamp from the scaled-up master with frame.

As one will understand, the flexible stamp has a side area which can be identified being frame pieces; with additional non-active area surface (flat or with roughened surface), having seams in between, and a non active area.

The invention is explained now in more detail with reference to the following figures, wherein the scope of the invention is not limited by the figures.

Figure 1:
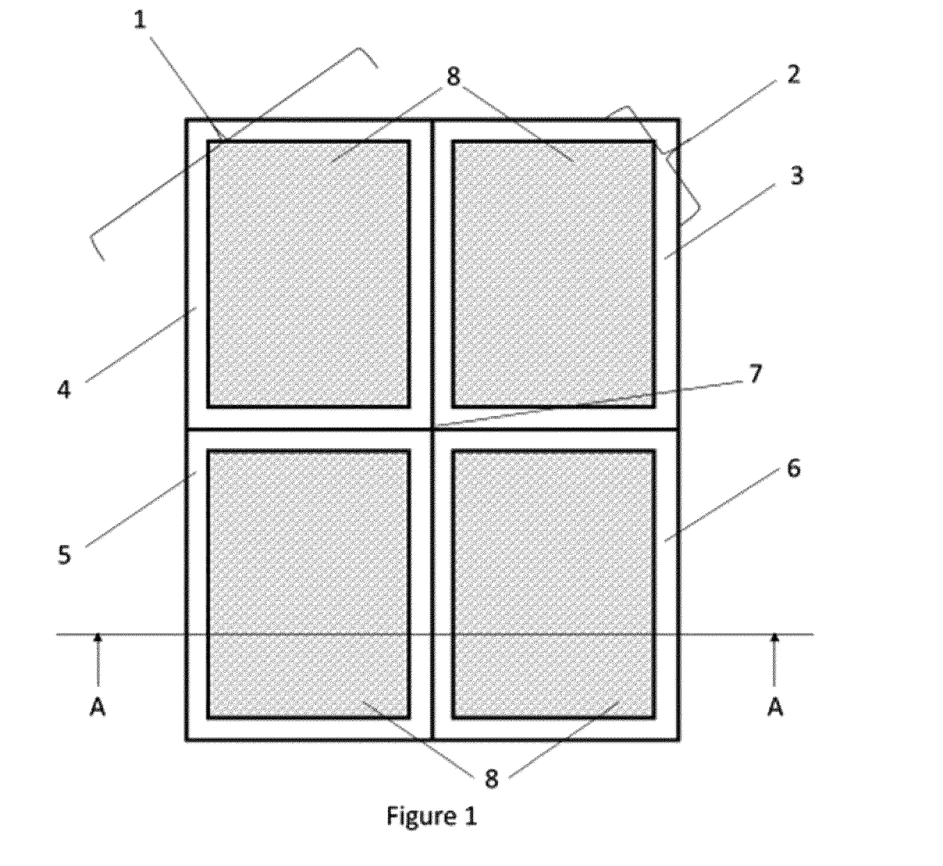
FIG. 1: Assembly of tiled master units with four corner junctions (prior art).

FIG. 1 shows a prior art assembly 1 comprising a scaled-up master 2 being made-up from four master units 3, 4, 5, 6. In this example, the four master units 3, 4, 5, 6 having a rectangular shape are arranged such that they meet with their corners at a center point thus forming a cross joint or cross junction 7. The master units 3, 4, 5, 6 may have active areas 8 with relief structure, which in the present case cover part of the surface of the master units 3, 4, 5, 6. Initially, the four master units 3, 4, 5, 6 are arranged with adjoining edges of neighboring master units being parallel with each other and the splice lines (also called stitch lines or seams) formed between adjoining edges of the master units 3, 4, 5, 6 are uniform and well controlled.

Figure 2:
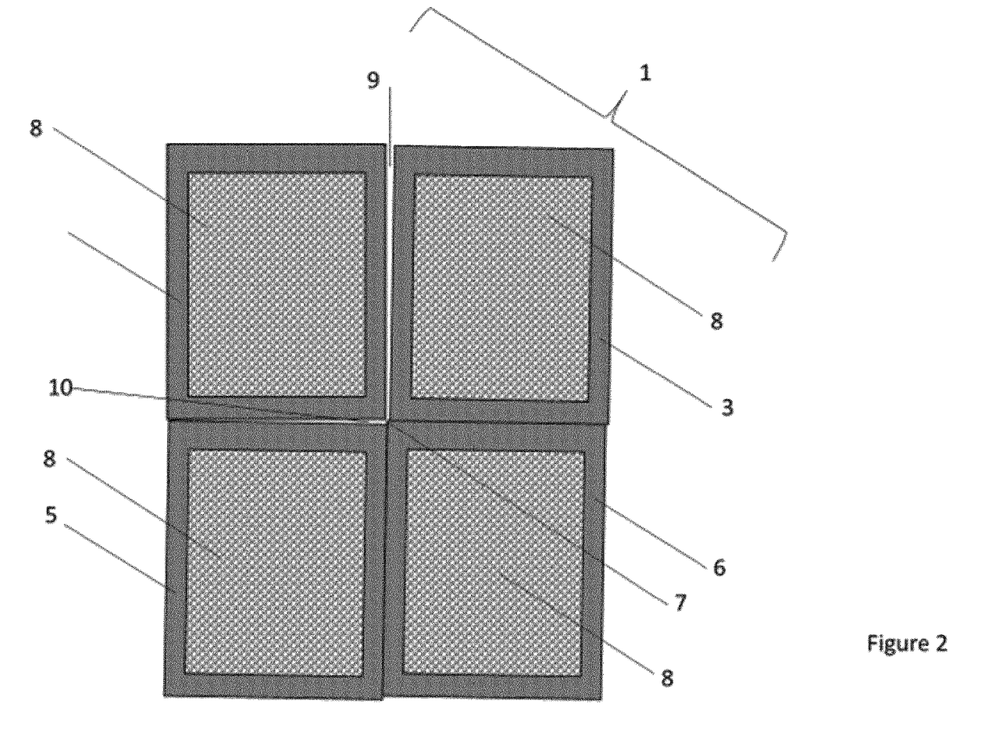
FIG. 2: Assembly of tiled master units of FIG. 1 with four corner junctions after being moved together when being conveyed to an imprinting station (prior art).

When the master units 3, 4, 5, 6 of the prior art assembly 1 of FIG. 1 are pushed or moved together when being conveyed to an imprinting station for transferring, i.e. imprinting the relief structure of the multitude of master units 3, 4, 5, 6 and the scaled-up master, respectively, to replicate a flexible stamp, the last master units 5 and 6 may push the other master units 3, 4 aside, resulting in a misaligned and rotated tiling. It should be mentioned that for such an assembly of master units forming a scaled-up master as shown in FIG. 2, misaligned and rotated tiling may already be created during the tiling process itself, i.e. when the master units 3, 4, 5, 6 are arranged next to each other. This leads to non-uniform gaps 9, 10 between the master units 3, 4, 5, 6 and high strain levels at the corners at cross junction 7, as shown in FIG. 2. When manufacturing of a large-area flexible stamp from this assembly 1 of master units 3, 4, 5, 6 having misaligned and rotated tiling and non-uniform gaps, also the flexible stamp will show the same deficiencies.

Figure 3:
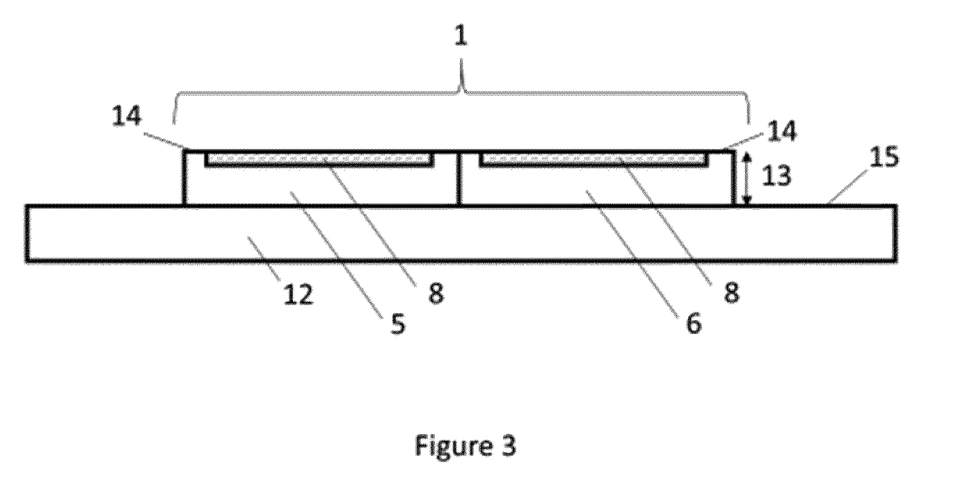
FIG. 3: Cross-section along line A-A though the assembly of FIG. 1 being placed on a substrate carrier (prior art).

FIG. 3 shows a cross-section of the assembly 1 of FIG. 1 along line A-A with master units 5, 6 being mounted and arranged side-by-side on a substrate carrier 12, each master unit 5, 6 having an active area 8 with relief structure. Master units 5, 6 have thickness $d_{master}$, leading to height step 13 between upper surface 14 of the master units 5, 6 and upper surface 15 of substrate carrier 12, which height step is equal to the thickness $d_{master}$.

Figure 4:
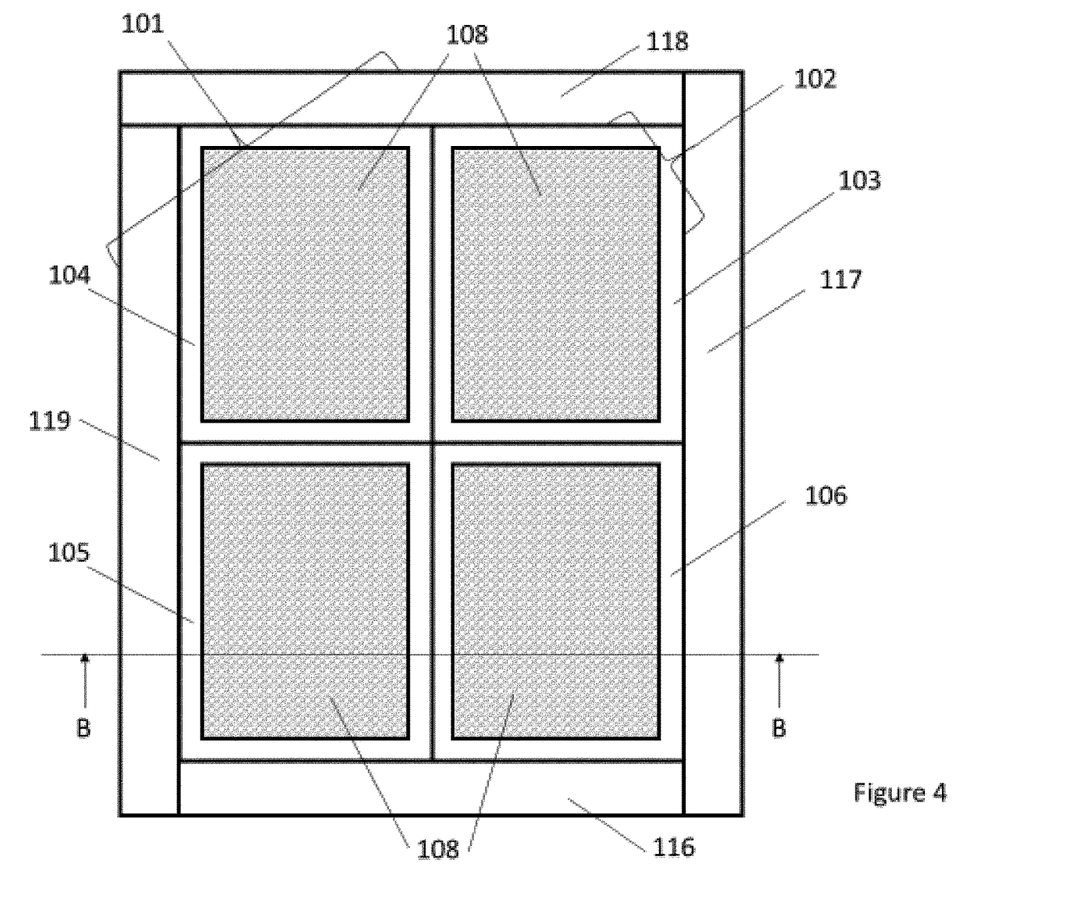
FIG. 4: Assembly according to the invention comprising a scaled-up master made-up from four tiled master units, and in addition comprising outer frame pieces.

FIG. 4 shows an assembly 101 according to the invention with a scaled-up master 102 being made-up from four master units 103, 104, 105, 106 having active areas 108 with relief structure. In addition to the prior art assembly 1 shown in FIG. 1, the assembly 101 of FIG. 3 comprises frame pieces 116, 117, 118, 119 being arranged around and flushing along the outer circumference of the master 102. With the frame pieces 116, 117, 118, 119 being arranged around and flushing along the outer circumference of scaled-up master 102 misaligning and rotating of the master units 103, 104, 105, 106 during processing for replicating a flexible stamp can at least be reduced. Instead, accurate alignment of the tiled master units 103, 104, 105, 106 in a process for replicating a flexible stamp from the scaled-up master 102 being made-up from the tiled master units 103, 104, 105, 106 can be facilitated.

Figure 5:
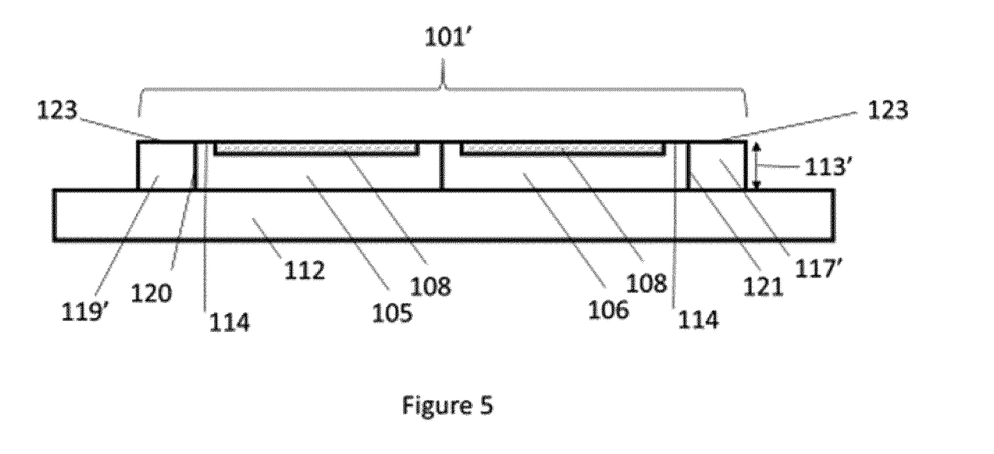
FIG. 5: Cross-section along line B-B through the assembly of FIG. 4 being placed on a substrate carrier with frame pieces having of the same thickness as the master units.

FIG. 5 is a cross-section of the assembly 101' of FIG. 4 along line B-B with master units 105, 106 shown in FIG. 5 lying and being arranged side-by-side on a substrate carrier 112, each master unit 105, 106 having an active area 108 with relief structure. At the outer edges 120, 121 of master units 105, 106 frame pieces 117', 119' are mounted as discrete pieces on the substrate carrier and are arranged around the master units. Preferably, frame pieces 117', 119' are removably mounted on the substrate carrier, but can also be fixed to the substrate carrier e.g. by a glue. In the embodiment shown in FIG. 5 frame pieces 117', 119' have the same thickness as master units 105, 106.

With an assembly 101' as shown in the cross section in FIG. 5 resin overflow will be transferred into the region of the frame pieces 117', 119' when a flexible stamp is replicated from the scaled-up master 102 shown in FIG. 4, wherein the resin flowing into the frame area has a controlled thickness which is the same as the thickness of the replicated flexible stamp. Formation of uncontrolled height steps and/or bumps at the edges of the scaled-up master unit 102 can be avoided and height step 113' between upper surface 114 of the master units 105, 106 and upper surface 123 of frame pieces 117', 119', respectively, and upper surface 115 of substrate carrier 112 is far from master units 105, 106.

Figure 6:
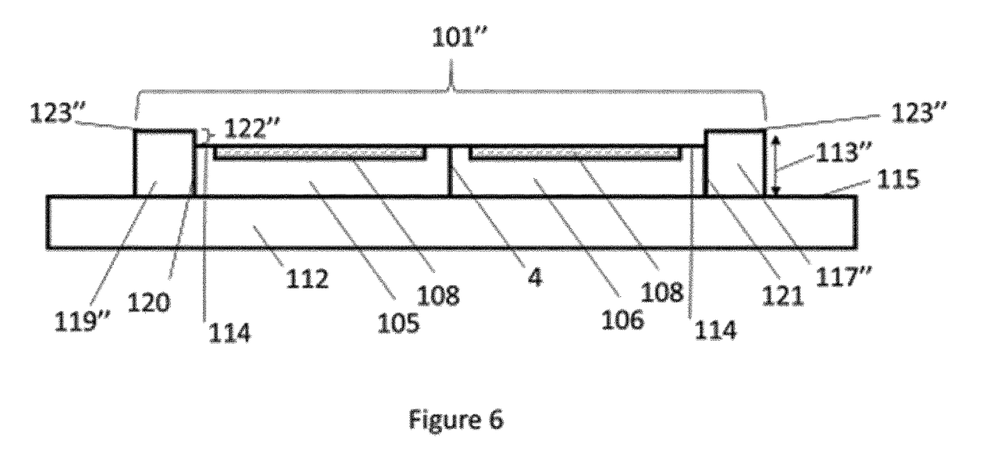
FIG. 6: Cross-section along line B-B through the assembly of FIG. 4 being placed on a substrate carrier with frame pieces, the thickness of which is larger than the thickness of the master units.

In FIG. 6 a further embodiment 101" of the cross-section of the assembly of FIG. 4 along line B-B with master units 105, 106 is shown. At the outer edges 120, 121 of master units 105, 106 frame pieces 117", 119" are mounted on the substrate carrier and are arranged around the master units, which frame pieces having a thickness which is larger than the thickness of master units 105, 106. In this case, a defined height step 122" is created between upper surface 114 of master units 105, 106 and upper surface 123" of frame pieces 117", 119", by which defined height step 122" the thickness of the active area of the flexible stamp is predetermined which is replicated from the assembly 101" shown in FIG. 6. Due to the frame pieces 117", 119", height step 113" to upper surface 115 of substrate carrier 112 is far from master units 105, 106. As in FIG. 4, frame pieces 117", 119" in FIG. 6 are distinct pieces separate from the support carrier.

Figure 7:
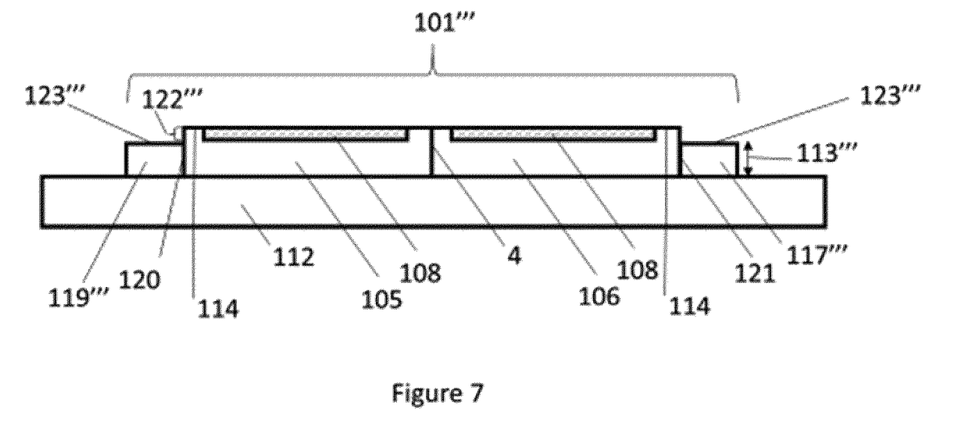
FIG. 7: Cross-section along line B-B through the assembly of FIG. 4 being placed on a substrate carrier with frame pieces, the thickness of which is less than the thickness of the master units.

A further embodiment 101'" of a cross-section of the assembly of FIG. 4 along line B-B is shown in FIG. 7. In this embodiment, an assembly with master units 105, 106 is shown. At the outer edges 120, 121 of master units 105, 106 frame pieces 117'", 119'" are mounted on a substrate carrier and are arranged around the master units, which frame pieces having a thickness which is less than the thickness of master units 105, 106 and of the scaled-up master 102, respectively. In this case, a defined height step 122'" is created between upper surface 114 of master units 105, 106 and upper surface 123'" of frame pieces 117'", 119'", which is lower. By adjusting the amount of resin used for replication of a flexible stamp from the assembly shown in FIG. 7, overflow of resin into the frame area can be controlled such that a defined height step is produced in the outer area of the flexible stamp which was allocated in the frame area during replication. This step increase in thickness of the flexible stamp at the sides of a master unit may later on serve as a vertical spacer that provides imprint thickness control of the final imprint product in a process for replicating the final imprint product from the flexible stamp.

Also, for the embodiment shown in FIG. 7, due to the frame pieces 117'", 119'" height step 113'" to upper surface 115 of substrate carrier 112 is far from master units 105, 106.

Figure 8:
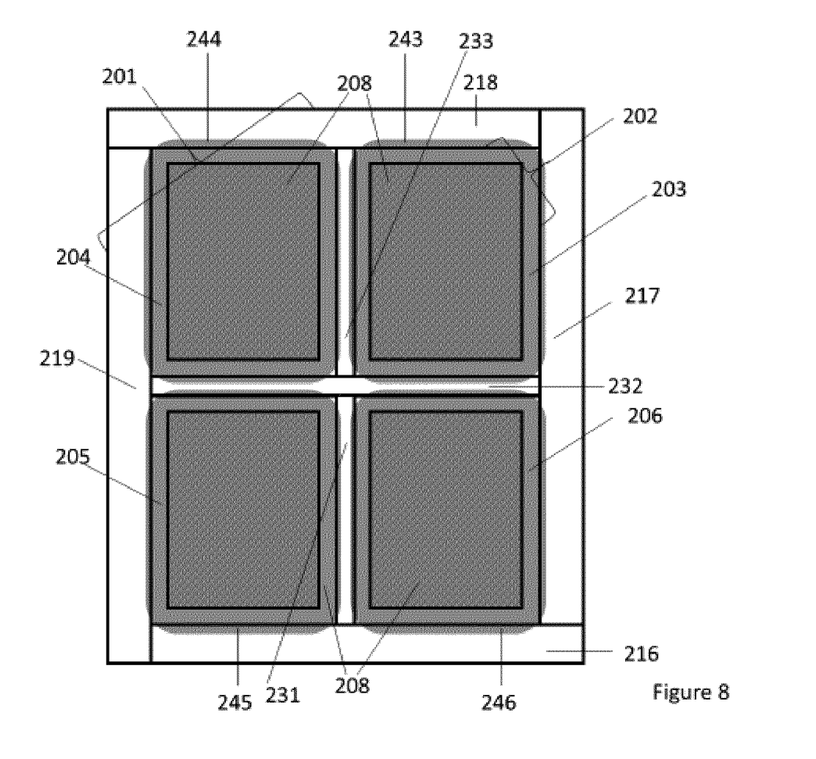
FIG. 8: Assembly according to the invention comprising a scaled-up master made-up from four master units, further comprising outer frame pieces and in addition intermediate frame pieces between the master units.

FIG. 8 shows an embodiment of an assembly 201 according to the invention with a scaled-up master 202 being built-up from four master units 203, 204, 205, 206 having active areas 208 like the assembly shown in FIG. 4. In contrast to the assembly of FIG. 4, the present assembly 201 has intermediate frame pieces 231, 232, 233 in addition to outer frame pieces 216, 217, 218, 219 being arranged around and flushing along the outer circumference of the master 202. By using such an assembly having also intermediate frame pieces 231, 232, 233, it is possible to control resin overflow at the outer circumference of the scaled-up master 202 as well as local resin flow in the inner area of the scaled-up master 202. In FIG. 8, an example of resin flow during replication of a flexible stamps from the four master units 203, 204, 205, 206 is indicated by the dark-grey areas 243, 244, 245, 246. As can be seen in this example, resin covers all active areas 208 and may also cover the areas of the master units 203, 204, 205, 206 surrounding the active areas 208. In addition, resin may flow into the frame areas of outer and intermediated frame pieces 216, 217, 218, 219, 231, 232, 233, whereby the thickness of the resin areas in the frame areas is controlled by the thickness of the frame pieces 216, 217, 218, 219, 231, 232, 233 in relation to the thickness of the master units 203, 204, 205, 206. Thus, master units 203, 204, 205, 206 e.g. may have different textures or structures in their active areas 208 on their upper surfaces which finally will lead to different imprint products. With the intermediate frame pieces 223, 224, 225 being arranged between the master units 203, 204, 205, 206 a clear distinction between the active areas 208 of the master units 203, 204, 205, 206 and thus between the different imprint products is possible. As described in previous embodiment, a step height at the intermediate frame pieces can function as a vertical spacer in the product replication process.

Figure 9:
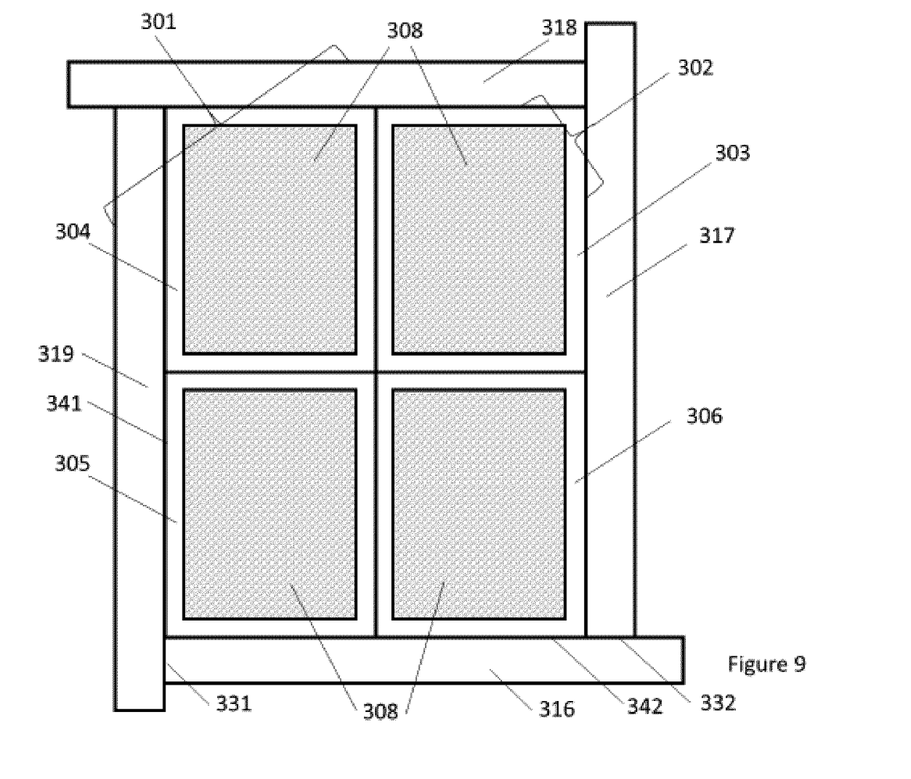
FIG. 9: Assembly according to the invention comprising a scaled-up master made-up from four master units, comprising in addition outer frame pieces shaped and oriented such that two neighboring edges of a frame piece form an extrapolation of two neighboring edges of the master.

In FIG. 9 an assembly 301 according to the invention comprising frame pieces is shown, which is similar to the assembly 101 of FIG. 4. In contrast to the assembly 101 of FIG. 4, the present assembly 301 has frame pieces 316, 317, 318, 319 being arranged around and flushing along the outer circumference of the master 302 being made-up from master units 303, 304, 305, 306, which frame pieces are shaped and oriented such that two neighboring edges of a frame piece form an extrapolation of two neighboring edges of master 302. For example, edges 331 and 332 of frame piece 316 form an extrapolation of edges 341 and 342 of master 302.

By this design of the frame pieces 316, 317, 318, 319 the length of the frame pieces does not have to be adapted exactly to the length of the edge of the master 302 the frame piece adjoins, but the length the frame pieces may be longer, as is shown in FIG. 9. In this way mismatch of the length of the frame pieces to the length of the edges of the master can be avoided.

Figure 10:
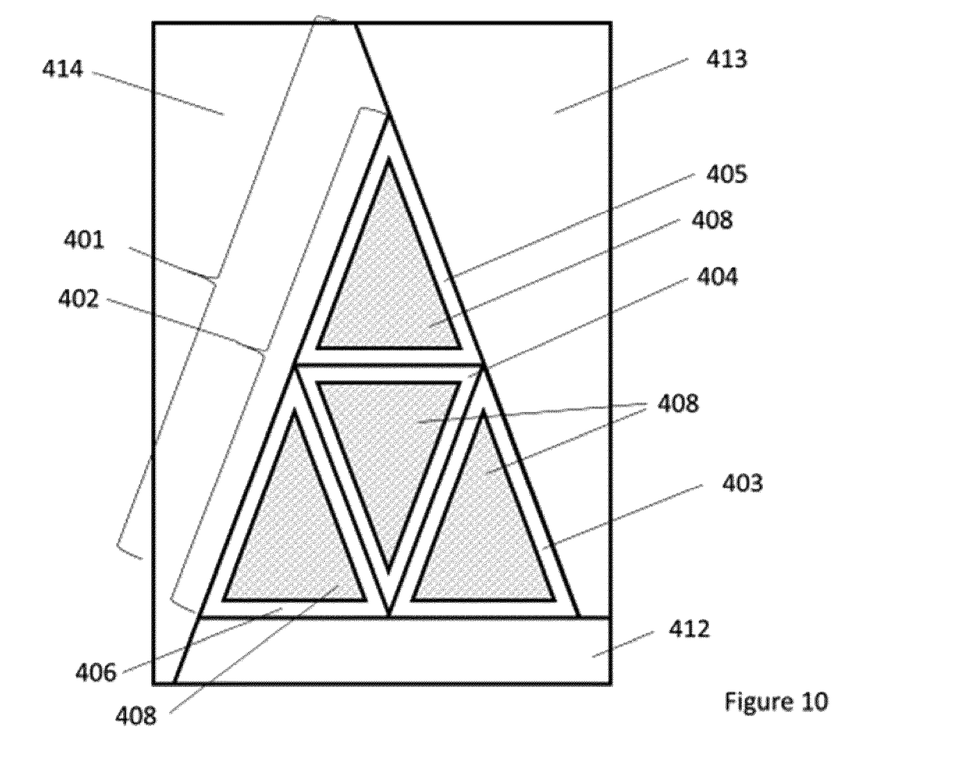
FIG. 10: Assembly according to the invention comprising a triangular scaled-up master, comprising in addition outer frame pieces shaped and arranged such that they form with their inner edges a triangle adapted to the scaled-up master and with their outer edges a rectangle.

FIG. 10 represents an assembly 401 according to the invention comprising a master 402 having a triangular shape. Master 402 is made-up from four triangular master units 403, 404, 405, 406 having active areas 408 with relief structure on their upper surface. The assembly 401 of FIG. 10 further comprises frame pieces 412, 413, 414 being arranged around and flushing along the outer circumference of the master 402. Shape, orientation and arrangement of frame pieces 412, 413, 414 is such that they form with their inner edges adjoining master 402 a triangle adapted in shape and size to master 402. The outer circumference of the arrangement of frame pieces 412, 413, 414 has the contour of a rectangle. The rectangular outer contour of the assembly 401 of FIG. 10 allows for an easy handling of the assembly in an imprint process for replicating a flexible stamp from triangular master 402, even though master 402 is built-up from a multitude of tiled master units 403, 404, 405, 406, which in the present case also have a triangular form. In addition, frame pieces 412, 413, 414 also facilitate alignment of triangular master units 403, 404, 405, 406 during a process to replicate a flexible stamp from scaled-up master 402.

It should be noted that also for the assembly shown in FIG. 10 frame pieces 412, 413, 414 are shaped and oriented such that two neighboring edges of a frame piece form an extrapolation of two neighboring edges of master 402. Like for the assembly shown in FIG. 9, by this problem resulting from a mismatch of the length of the frame pieces to the length of the edges of the master can be reduced. However, for the example shown in FIG. 10 the length of frame piece 414 still has to be adapted exactly to the length of the edge of master 402 it adjoins as well as to the width of frame piece 412.

The invention claimed is:

1. An assembly comprising:
a master for imprinting of micro-structures and nano-structures, the master being arranged on a substrate carrier and having on an upper surface an active area with relief structure for imprinting of the micro-structures and nano-structures, the master having a thickness $d_{master}$;
a set of frame pieces mounted on the substrate carrier, wherein a length of each frame piece is longer than a length of an adjacent edge of the master, and wherein all of the frame pieces are arranged around and flush along an outer circumference of the master and are shaped and oriented so that two neighboring edges of each frame piece form an extrapolation of two neighboring edges of the master, the frame pieces having a thickness $d_{frame}$, wherein the thickness $d_{frame}$ of the frame pieces deviates from the thickness $d_{master}$ of the master by at most 250 μm.

2. The assembly according to claim 1, wherein the master is a scaled-up master, the scaled-up master comprising a plurality of tiled master units having on upper surfaces active areas with relief structure for imprinting of the micro-structures and nano-structures, the upper surfaces of the tiled master units forming in total the upper surface of the scaled-up master.

3. The assembly according to claim 2, wherein the set of frame pieces further comprises intermediate frame pieces which are mounted on the substrate carrier and are arranged between tiled master units and flush along side edges of the tiled master units adjoining the intermediate frame pieces.

4. The assembly according to claim 1, wherein the thickness $d_{frame}$ of the frame pieces differs from the thickness $d_{master}$ of the master.

5. The assembly according to claim 1, wherein the frame pieces have a width of at least 5 mm.

6. The assembly according to claim, 1, wherein the frame pieces have an optically detectable relief structure on a surface being directed in a same direction as the upper surface of the master.

7. An assembly comprising:
a master for imprinting of micro-structures and nano-structures, the master being arranged on a substrate carrier and having on an upper surface an active area with relief structure for imprinting of the micro-structures and nano-structures, the master having a thickness $d_{master}$;
a set of frame pieces mounted on the substrate carrier and arranged around and being flush along an outer circumference of the master, the frame pieces having a thickness $d_{frame}$, wherein the thickness $d_{frame}$ of the frame pieces deviates from the thickness $d_{master}$ of the master by at most 250 μm;
wherein the outer circumference of the master has a non-quadratic and non-rectangular contour and the frame pieces arranged around the outer circumference of the master are shaped and arranged such that edges adjoining the master are adapted in shape and size to follow the contour of the circumference of the master while the frame pieces with outer edges form a square or rectangle.

8. The assembly according to claim 2, the scaled-up master comprising tile-shaped master units, wherein adjoining edges of neighboring master units are parallel with each other and wherein the master units forming the master are arranged such that splice lines between the master units only have junctions between master units where at most three corners of neighboring master units are brought together.

9. A method of using frame pieces in an imprint process for manufacturing a flexible stamp, comprising:
replicating the flexible stamp from a master having on an upper surface an active area with relief structure for imprinting of micro-structures and nano-structures, wherein the master has a thickness $d_{master}$;
arranging the frame pieces around an outer circumference of the master and positioning the frame pieces flush with the outer circumference of the master;
wherein a length of each frame piece is longer than a length of an adjacent edge of the master and wherein all of the frame pieces are arranged around and flush along the outer circumference of the master, and wherein all of the frame pieces are shaped and oriented so that two neighboring edges of each frame piece form an extrapolation of two neighboring edges of the master;
wherein the frame pieces have a thickness $d_{frame}$, wherein the thickness $d_{frame}$ of the frame pieces deviates from the thickness $d_{master}$ of the master by at most 250 μm and wherein master and frame pieces are mounted on a substrate carrier and are distinct from the substrate carrier;
imprinting with the active area of the master.

10. The method according to claim 9 wherein the master is a scaled-up master comprising a plurality of tiled master units having on an upper surface, active areas with relief structure for imprinting of micro-structures and nano-structures, the upper surfaces of the tiled master units forming in total the upper surface of the scaled-up master and the frame pieces being arranged at least around and flushing along the outer circumference of the scaled-up master.

11. The method according to claim 9 wherein, the thickness $d_{frame}$ of the frame pieces is larger than the thickness $d_{master}$ of the master by at most 250 μm.

12. The method according to claim 9, wherein the frame pieces have a relief structure on the upper surface controlling resin flow during an imprint process.

13. The method according to claim 10, wherein the scaled-up master comprises tile-shaped tiled master units, wherein adjoining edges of neighboring tiled master units are parallel with each other and wherein the tiled master units are arranged in the flexible stamp such that splice lines between the sub-units only have junctions between sub-units wherein at most three corners of neighboring sub-units are brought together.

14. A flexible stamp from a master having on an upper surface an active area with relief structure for imprinting of micro-structures and nano-structures, rendered to the flexible stamp by the assembly according to claim 2.

* * * * *